United States Patent
Liu et al.

(10) Patent No.: US 10,212,860 B2
(45) Date of Patent: Feb. 19, 2019

(54) ADAPTIVE AUTOMATIC COMPUTER ROOM AIR CONDITIONERS (CRAC) MASTER CONTROL METHOD AND SYSTEM

(71) Applicant: Archimedes Controls Corp., Pleasanton, CA (US)

(72) Inventors: Xiang Liu, San Francisco, CA (US); Liangcai Tan, Dublin, CA (US); Xin Hu, Dublin, CA (US)

(73) Assignee: Archimedes Controls Corp., Pleasanton, CA (US)

( * ) Notice: Subject to any disclaimer, the term of this patent is extended or adjusted under 35 U.S.C. 154(b) by 0 days.

(21) Appl. No.: 15/382,000

(22) Filed: Dec. 16, 2016

(65) Prior Publication Data

US 2017/0176039 A1 Jun. 22, 2017

Related U.S. Application Data

(60) Provisional application No. 62/269,913, filed on Dec. 18, 2015.

(51) Int. Cl.
| | |
|---|---|
| *G05B 15/02* | (2006.01) |
| *F24F 11/30* | (2018.01) |
| *F24F 11/52* | (2018.01) |
| *F24F 11/62* | (2018.01) |
| *F24F 11/63* | (2018.01) |

(Continued)

(52) U.S. Cl.
CPC ....... *H05K 7/20836* (2013.01); *G05B 13/024* (2013.01); *G05B 15/02* (2013.01); *H05K 7/20745* (2013.01); *F24F 11/30* (2018.01); *F24F 11/52* (2018.01); *F24F 11/62* (2018.01); *F24F 11/63* (2018.01); *F24F 2110/10* (2018.01); *F24F 2140/60* (2018.01); *G05B 2219/2614* (2013.01)

(58) Field of Classification Search
CPC .. F24F 11/54; F24F 2110/10; G05D 23/1923; G05D 23/30; G05D 23/1932; G05B 15/02; G05B 2219/2614
USPC .......................... 700/276, 277, 278, 299, 300
See application file for complete search history.

(56) References Cited

U.S. PATENT DOCUMENTS

| | | | |
|---|---|---|---|
| 7,194,337 B2* | 3/2007 | Sharma | ............. G05D 23/1931 156/200 |
| 8,760,293 B2 | 6/2014 | Steiner | |

(Continued)

OTHER PUBLICATIONS

Tan et al., U.S. Appl. No. 62/269,902, filed Dec. 18, 2015; 8 pages.

(Continued)

*Primary Examiner* — Michael J Brown
(74) *Attorney, Agent, or Firm* — Morrison & Foerster LLP

(57) ABSTRACT

Described is an adaptive automatic computer room air conditioner (CRAC) or computer room air handler (CRAH, CRAC and CRAH is referred interchangeably in this article) group control method. This method automatically controls each HVAC unit's on/off status, return temperature set point, fan speed or cooling valve position to secure the data center thermal environment for server's secure running and minimize the cooling energy use. The method creates a comprehensive feedback control loop between temperature sensor network, data center environment and CRACs.

18 Claims, 5 Drawing Sheets

(51) Int. Cl.
*H05K 7/20* (2006.01)
*G05B 13/02* (2006.01)
*F24F 110/10* (2018.01)
*F24F 140/60* (2018.01)

(56) References Cited

U.S. PATENT DOCUMENTS

| | | |
|---|---|---|
| 2006/0168972 A1* | 8/2006 | Fry .................................. 62/157 |
| 2011/0092164 A1 | 4/2011 | Spanhake |
| 2013/0278377 A1 | 10/2013 | Slupsky et al. |
| 2014/0002239 A1 | 1/2014 | Rayner |
| 2014/0062669 A1 | 3/2014 | Mena et al. |
| 2015/0331977 A1 | 11/2015 | Healey et al. |
| 2017/0013069 A1 | 1/2017 | Grohman |
| 2017/0176033 A1 | 6/2017 | Tan et al. |
| 2017/0177762 A1 | 6/2017 | Liu et al. |
| 2017/0180913 A1 | 6/2017 | Tan et al. |
| 2017/0188121 A1 | 6/2017 | Tan et al. |

OTHER PUBLICATIONS

Tan et al. U.S. Office Action dated Nov. 1, 2017, directed to U.S. Appl. No. 15/382,017; 7 pages.
Liu et al. U.S. Office Action dated Jan. 2, 2018 directed to U.S. Appl. No. 15/382,058; 10 pages.

* cited by examiner

ADAPTIVE AUTOMATIC COMPUTER ROOM AIR CONDITIONERS (CRAC) MASTER CONTROL METHOD AND SYSTEM

CROSS-REFERENCE TO RELATED APPLICATION

This application claims the benefit of U.S. Provisional Application No. 62/269,913, filed Dec. 18, 2015, the entire contents of which is incorporated herein by reference.

FIELD OF THE INVENTION

The present invention relates to mechanical cooling system optimal control and energy efficiency.

BACKGROUND OF THE INVENTION

Data centers are one of the largest and fastest growing consumers of electricity in the United States. In 2013, U.S. data centers consumed an estimated 91 billion kilowatt-hours of electricity—enough electricity to power all the households in New York City twice over—and are on-track to reach 140 billion kilowatt-hours by 2020. To ensure safe operation of a data center, its cooling system usually is over sized and runs excessively to keep it as cool as possible. This however sacrifices cooling efficiency and cooling energy consumption therefore skyrockets. A smart cooling system control logic which drives the cooling system to provide just the right level of cooling so safety may be guaranteed with minimum cooling energy use, is desired.

There are a few companies who propose control logic that aims to address the above issues. Some of them adapt several inherently conflicting indices in their control logic, resulting in less efficient control results. Some use a single HVAC unit to address hot spots, resulting in unsatisfactory thermal conditions. Some are specific to a certain type of server, rack or cooling system. Still some require human intervention and are not automatic enough.

SUMMARY OF THE INVENTION

In accordance with the present invention, there is provided a smart adaptive cooling system control algorithm. The algorithm uses rack cooling index over temperature (RCIHI) to determine the existence of hot spots and maintains the RCIHI at a desired level. The logic generates cooling request to other computer room air conditioners (CRACs) when hot spots happen or persist. The purpose is to try to get extra cooling from other CRACs. In absence of hot spots, cooling requests are recalled gradually. In absence of cooling request, the CRAC adjusts its control target to maintain the RCIHI at the desired level. Each CRAC runs the control algorithm independently.

In some embodiments, the described systems provide a dynamically adaptive algorithm to optimally control each component of the cooling system, including but not limited to HVAC unit's on/off status, return air temperature, supply fan speed, and cooling valve.

In some embodiments, a logic that uses a special index to determine the thermal health of a data center and for control logic is provided. In some embodiments, this special index is used to control the computer room air conditioning systems. In some embodiments, an algorithm that networks all available HVAC units to help eliminate hot spots is provided. In some embodiments, a generic control logic which can be adapted to any data centers, independent of types of servers, racks, and cooling equipment is provided. In some embodiments, a control logic that minimizes cooling energy consumption and ensures normal operation for data centers is provided. In some embodiments, a fully automatic control logic without human intervention is provided.

In some embodiments, an adaptive automatic computer room air conditioners (CRAC) master control method for optimizing mechanical cooling systems and minimize cooling energy consumption in data centers comprises determining a rack cooling index over temperature (RCIHI) for one or more racks under control of a first CRAC, determining the existence of hot spots using the determined RCIHI, maintaining the RCIHI at a desired level by generating cooling requests to one or more other CRACs in addition to the first CRAC when hot spots occur or persist, and recalling the cooling requests when the hotspot is eliminated.

BRIEF DESCRIPTION OF THE DRAWINGS

A complete understanding of the present invention may be obtained by reference to the accompanying drawings, when considered in conjunction with the subsequent, detailed description, in which.

For purposes of clarity and brevity, like elements and components will bear the same designations and numbering throughout the Figures.

DETAILED DESCRIPTION OF THE INVENTION

Figure 1:
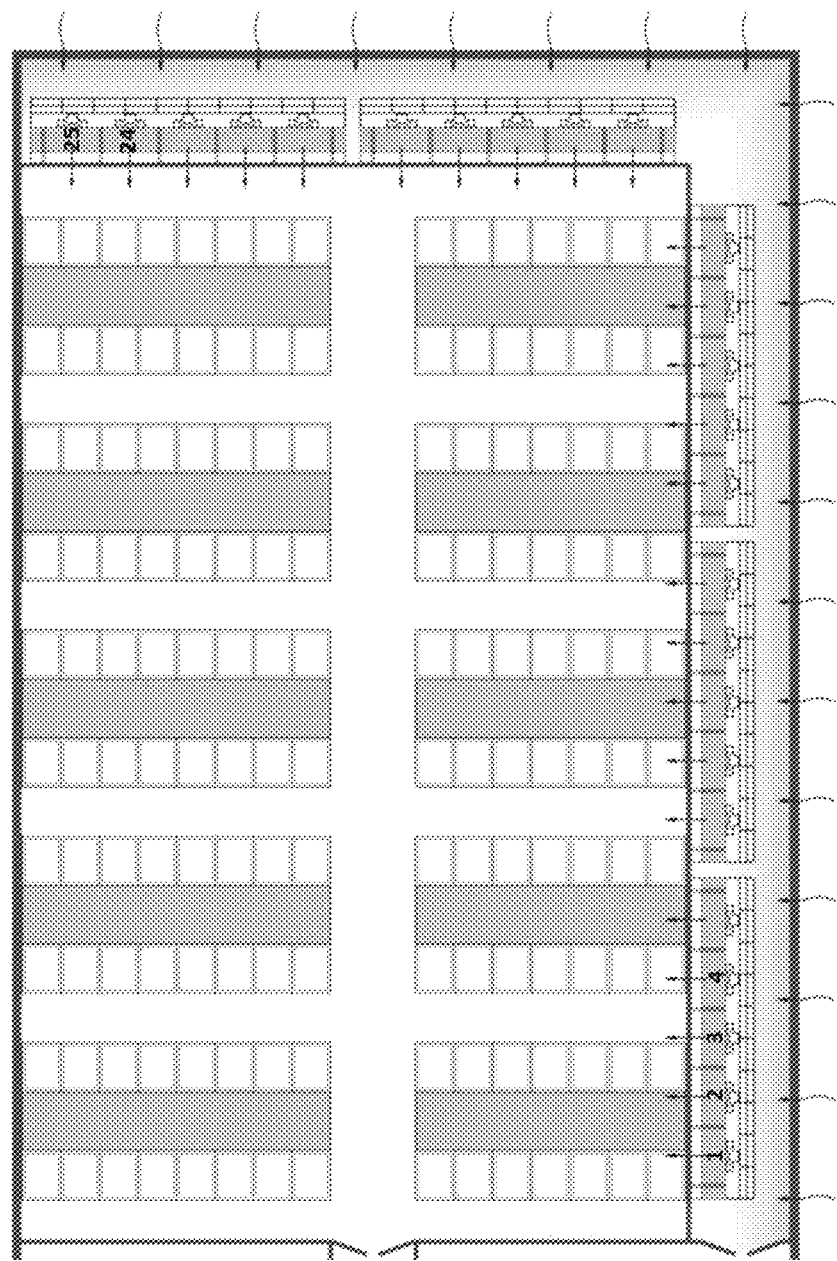
FIG. 1 is a plan view of a data center in accordance with the invention.

FIG. 1 is a plan view of a data center 1. The data center 1 includes one or multiple racks (rack 2) and CRAC units (CRAC unit 3). A rack 2 consists of one or multiple computer equipment. For example, there are 25 CRACs and 10 columns of racks, with 15 racks each column in FIG. 1. This method can be used in rooms with any numbers of CRAC units.

Figure 2:
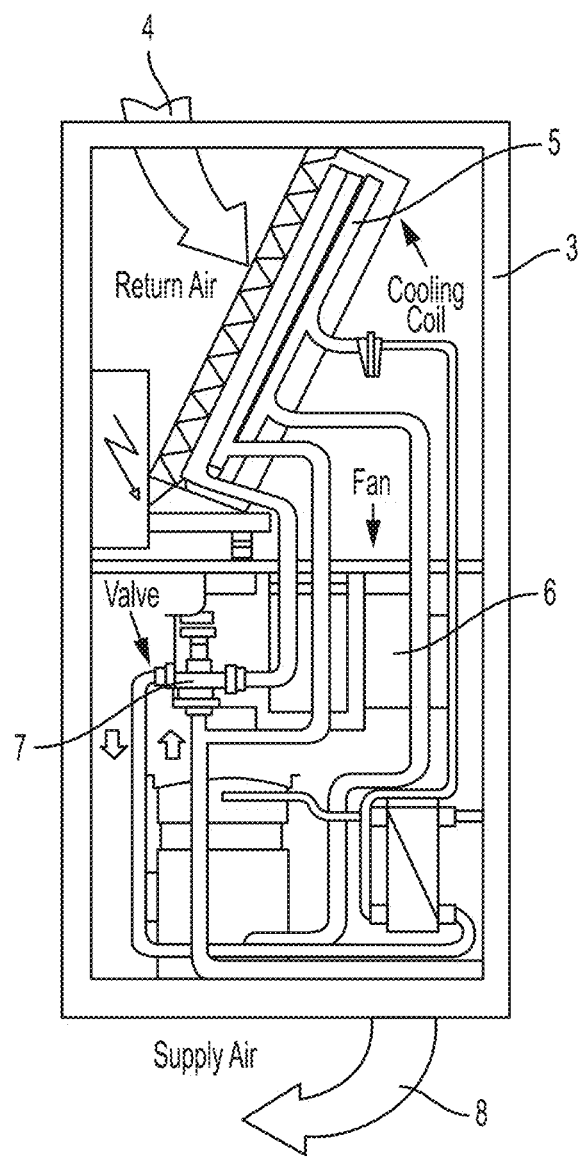
FIG. 2 is an elevation view of a computer room air conditioning unit shown in FIG. 1.

FIG. 2 is an elevation view of a CRAC unit 3 shown in FIG. 1. Return air 4 from internal space of the data center 1 is drawn by the supply fan 6 through the top of the unit. After passing through the cooling coil 5, it is cooled and becomes cool supply air 8. Inside the cooling coil 5 runs chilled water, refrigerant or other cold media, the flow of which is regulated by the cooling valve 7. Temperature of the return air 4 (RAT) usually is the control target of the CRAC unit 3. Speed of the supply fan 6 or the cooling valve 7 or another means is adjusted to vary the cooling output of the CRAC unit 3 and maintain the control target, in this case the RAT, at a desired level.

Figure 3A:
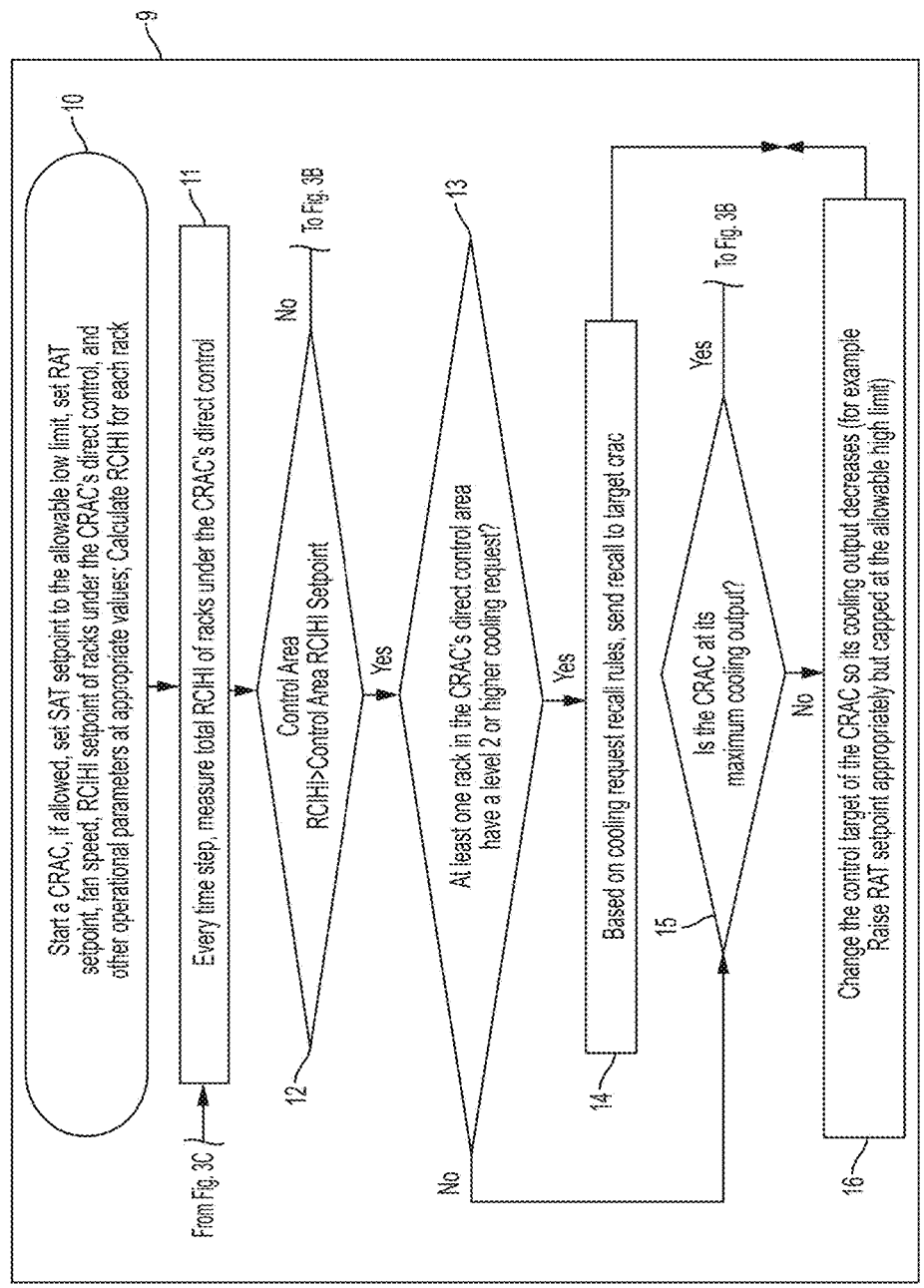
FIGS. 3A-3C are flow charts of the adaptive control process.
Figure 3B:
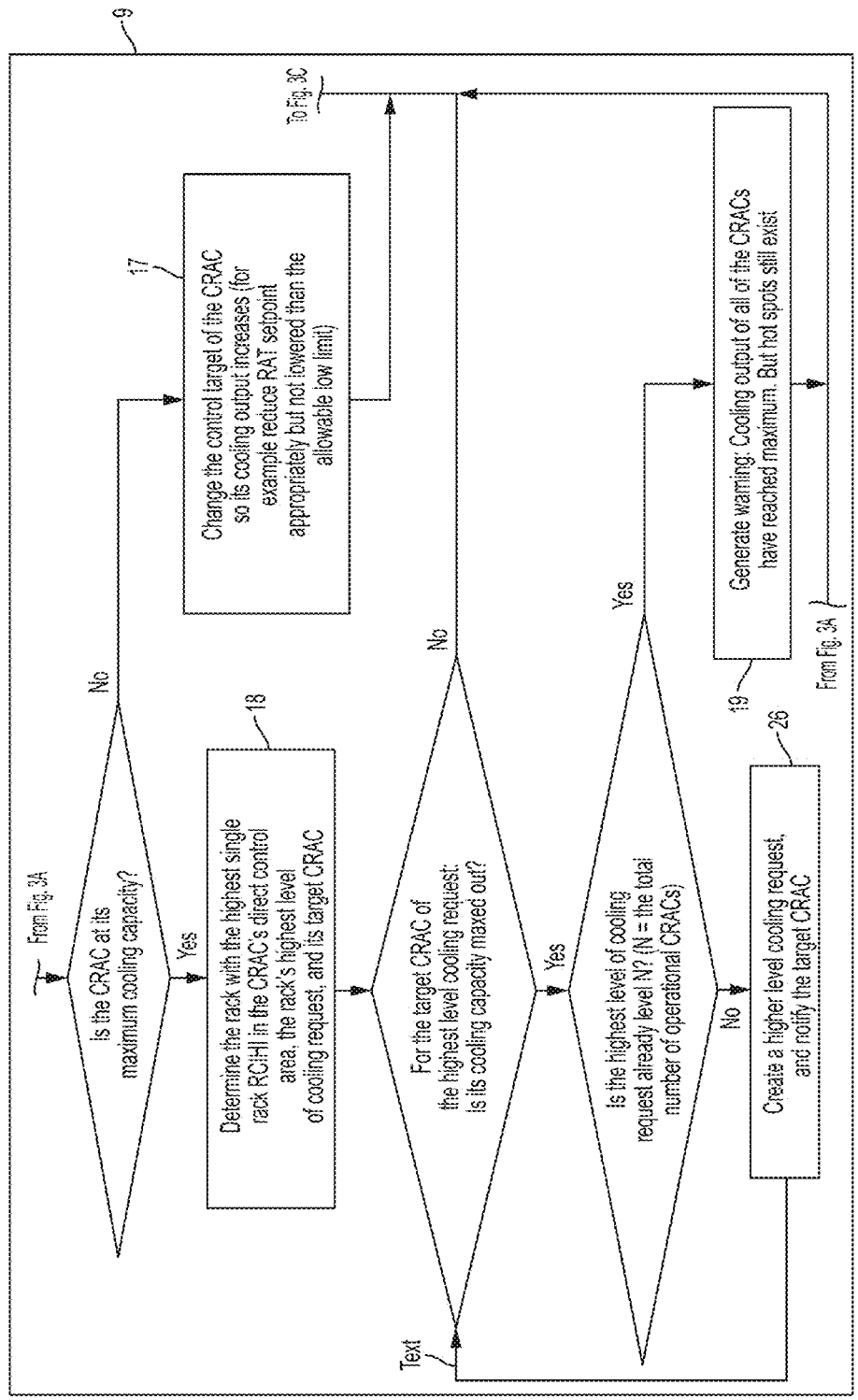
Figure 3C:
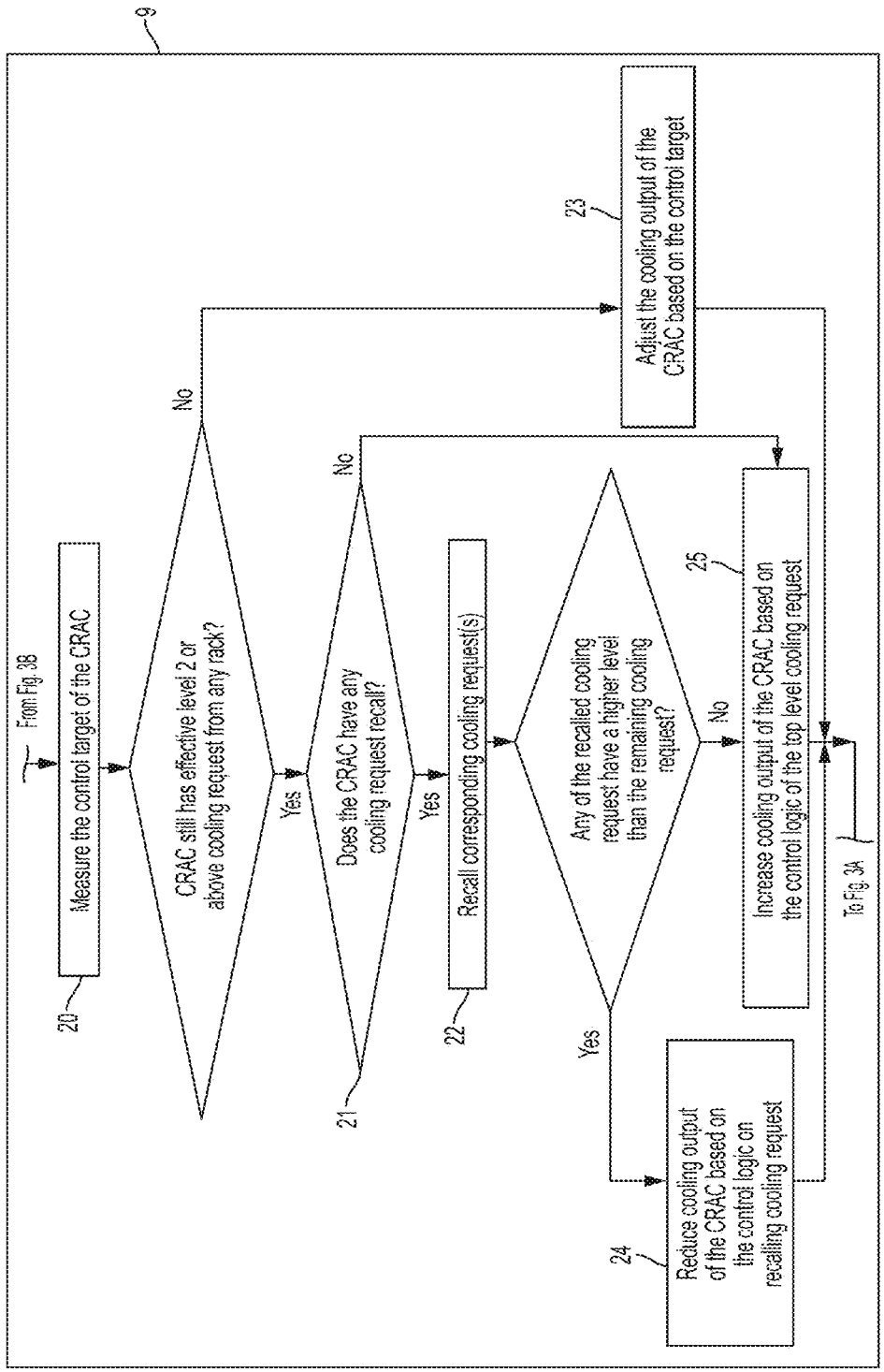

FIGS. 3A-3C are flow charts of the smart adaptive cooling system control logic that's run by each CRAC unit 3. It is a repetitive control process 9 based on several concepts: RCIHI of a CRAC's direct control racks, RCIHI of a single rack 2 and cooling request. RCI (Rack Cooling Index) is a best practice performance metric for quantifying the conformance with thermal data center standards such as ASHRAE and NEBS. The RCI metric compresses the intake temperatures (measured or modeled) into two numbers: RCIHI and RCILO (Rack Cooling Index Under Temperature). The two indices are measures of the equipment room health at the high (HI) and at the low (LO) end of the temperature range, respectively. RCIHI can be calculated for multiple racks or a single rack. A level m cooling request is defined as: when a rack has to get extra cooling from its level m (m is an integer) CRAC because its own RCIHI or the RCIHI of the direct control area it is in, is below the setpoint, and all of the m−1 CRAC before the level m CRAC in the CRAC priority vector reaches the maximum cooling output, the cooling request is a level m cooling request.

The control logic begins by turning on a CRAC and setting operational parameters to default values at box start 10. RCIHI of all of the racks under the CRAC's direct control is measured and calculated at box measure RCIHI 11. At box compare RCIHI 12, the actual RCIHI of the CRAC's direct control area is compared to the setpoint.

When the actual RCIHI is above its setpoint, if at least one rack in the CRAC's direct control area has a level 2 or higher cooling request (at box cooling request exists 13), generate cooling request recall based on appropriate rules, and send the recall to target CRAC at box generate cooling request recall 14, and goes on to box measure CRAC control target 20. But if no cooling request exists, if the CRAC's cooling output is not at maximum (compared at box CRAC at max cooling 15), change the control target of the CRAC so its cooling output decreases (for example raise RAT setpoint appropriately but capped at the allowable high limit (at box decrease cooling 16). Otherwise, goes on to box measure CRAC control target 20.

When the actual RCIHI is below its setpoint, if the CRAC's cooling output is not maxed out, increases the cooling output at box increase cooling 17 and move to the box measure CRAC control target 20. Otherwise, the area has to get extra cooling from other CRACs. In order to do so, at box find highest RCIHI rack 18, identify the rack with the highest single rack RCIHI in the CRAC's direct control area, the highest level cooling request of the identified rack, and the target CRAC associated with the highest level cooling request. The logic shall keep generating a higher level cooling request at box generate cooling request 26 if the target CRAC of the existing top cooling request is at its maximum cooling output. If cooling output of all of the CRACs have reached maximum, but hot spots still exist, a warning should be generated at box warning generation 19.

After measuring the CRAC control target at box measure CRAC control target 20, if the CRAC does not have any cooling request from any rack, the CRAC maintains the control target at box maintain control target 20. Otherwise system checks whether the CRAC receives any cooling request recall at box cooling request recall 21. If no, increase cooling output of the CRAC occurs based on the control logic of cooling request at box adjust cooling by control target 23. If yes, perform the recall at box perform recall 22. If the top level cooling request is recalled, reduce CRAC cooling output based on the control logic of recalling cooling request at box reduce cooling by recall 24. Otherwise, continue increasing CRAC cooling output based on the control logic of the top level cooling request at box increase cooling by top cooling call 25. After all of the above steps, current control cycles ends. A new control cycle starts from box measure RCIHI 11 again.

Each CRAC runs the above control algorithm independently.

Thus, in summary, it can be seen that what is provided is a smart adaptive cooling system control algorithm. The algorithm uses RCIHI to determine the existence of hot spots and maintains the RCIHI at a desired level. The logic generates cooling request to other CRACs when hot spots happen or persist. The purpose is to try to get extra cooling from other CRACs. In absence of hot spots, cooling requests are recalled gradually. In absence of cooling request, the CRAC adjusts its control target to maintain the RCIHI at the desired level.

Each CRAC system can include one or more of processors for running the control algorithm and software. The processor may be any suitable type of processor capable of communicating with the other components of the system in order to execute computer-readable instructions and to cause system to carry out actions in accordance with the instructions. For example, the processor may access a computer program (e.g., software) that may be stored on storage and execute the program to cause the system to perform various actions in accordance with the program. In some embodiments, a computer program or other instructions executed by processor may be stored on any transitory or non-transitory computer-readable storage medium readable by processor.

The CRAC system may also include any suitable device capable of transmitting and receiving signals over a network, such as a network interface chip or card. The CRAC system may also include storage that can be any suitable device the provides storage, such as an electrical, magnetic or optical memory including a RAM, cache, hard drive, CD-ROM drive, tape drive or removable storage disk. Software may be stored in storage and executed by the processor, may include, for example, the programming that embodies the functionality of the methods, techniques, and other aspects of the present disclosure (e.g., as embodied in the computers, servers and devices as described above).

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying figures, it is to be noted that various changes and modifications will become apparent to those skilled in the art. Such changes and modifications are to be understood as being included within the scope of the disclosure and examples as defined by the claims.

What is claimed is:

1. An adaptive automatic computer room air conditioners (CRAC) master control method for optimizing mechanical cooling systems and minimize cooling energy consumption in data centers comprising:

at a first CRAC in a data center comprising a plurality of CRACs:
determining a total rack cooling index over temperature (RCIHI) for a plurality of racks under control of the first CRAC based on an RCIHI for each rack of the plurality of racks;
determining the existence of hot spots by comparing the determined total RCIHI with a desired level; and
maintaining the total RCIHI at the desired level by:
determining whether a cooling output of the first CRAC is at a maximum cooling capacity,
generating cooling requests to one or more other CRACs from the plurality of CRACs when the existence of hot spots is determined and when the cooling output of the first CRAC is determined to be at the maximum cooling capacity, and recalling one or more of the cooling requests when the hot spot is eliminated.

2. The method of claim 1, wherein generating the cooling requests comprises:

identifying a rack from the plurality of racks as having the highest RCIHI; and selecting the one or more other CRACs based on one or more cooling requests associated with the identified rack.

3. The method of claim 1, wherein determining the existence of hot spots comprises:

determining whether the total RCIHI is below the desired level.

4. The method of claim 1, wherein maintaining the RCIHI at the desired level comprises:

controlling the cooling output of the first CRAC based on a presence of one or more cooling requests from the one or more other CRACs and whether any of the one or more cooling requests from the other CRACs has been recalled.

5. The method of claim 1, wherein maintaining the RCIHI at the desired level, comprises:

adjusting a control target of the first CRAC to adjust the cooling output upon determining that the cooling output of the first CRAC is below the maximum cooling capacity.

6. The method of claim 5, wherein the control target is adjusted in response to determining an absence of cooling requests from the one or more other CRACs of the plurality of CRACs.

7. The method of claim 5, wherein the control target is a temperature of return air (RAT) setpoint of the first CRAC.

8. The method of claim 7, wherein adjusting the control target comprises:

reducing the RAT setpoint upon determining that the total RCIHI is below the desired level.

9. The method of claim 7, wherein adjusting the control target comprises:

increasing the RAT setpoint upon determining that the total RCIHI is above the desired level.

10. A system for controlling adaptive automatic computer room air conditioners (CRAC) to optimize mechanical cooling systems and minimize cooling energy consumption in data centers comprising:

a plurality of CRAC in a data center, wherein each CRAC is configured to:

determine a total rack cooling index over temperature (RCIHI) for a plurality of racks under control of the CRAC based on an RCIHI for each rack of the plurality of racks;

determine the existence of hot spots by comparing the determined total RCIHI with a desired level; and maintain the total RCIHI at the desired level by:

determining whether a cooling output of the CRAC is at a maximum cooling capacity, generating cooling requests to one or more other CRACs from the plurality of CRACs when the existence of hot spots is determined and when the cooling output of the CRAC is determined to be at the maximum cooling capacity, and recalling one or more of the cooling requests when the hot spot is eliminated.

11. The system of claim 10, wherein to generate the cooling requests, the CRAC is configured to:

identify a rack from the plurality of racks as having the highest RCIHI; and select the one or more other CRACs based on one or more cooling requests associated with the identified rack.

12. The system of claim 10, wherein to determine the existence of hot spots, the CRAC is configured to:

determine whether the total RCIHI is below the desired level.

13. The system of claim 10, wherein to maintain the RCIHI at the desired level, the CRAC is configured to:

control the cooling output of the first CRAC based on a presence of one or more cooling requests from the one or more other CRACs and whether any of the one or more cooling requests from the other CRACs has been recalled.

14. The system of claim 10, wherein to maintain the RCIHI at the desired level, the CRAC is configured to:

adjust a control target of the first CRAC to adjust the cooling output upon determining that the cooling output of the first CRAC is below the maximum cooling capacity.

15. The system of claim 14, wherein the CRAC is configured to adjust the control target in response to determining an absence of cooling requests from the one or more other CRACs of the plurality of CRACs.

16. The system of claim 14, wherein the control target is a temperature of return air (RAT) setpoint of the first CRAC.

17. The system of claim 16, wherein to adjust the control target, the CRAC is configured to:

reduce the RAT setpoint upon determining that the total RCIHI is below the desired level.

18. The system of claim 16 wherein to adjust the control target, the CRAC is configured to:

increase the RAT setpoint upon determining that the total RCIHI is above the desired level.

* * * * *